United States Patent
Hansen

(10) Patent No.: US 9,318,865 B2
(45) Date of Patent: Apr. 19, 2016

(54) VISION ENHANCEMENT ILLUMINATORS

(71) Applicant: Sensors Unlimited, Inc., Princeton, NJ (US)

(72) Inventor: Marc Hansen, Hamilton, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 87 days.

(21) Appl. No.: 14/265,032

(22) Filed: Apr. 29, 2014

(65) Prior Publication Data

US 2015/0309262 A1  Oct. 29, 2015

(51) Int. Cl.
*H01S 3/00* (2006.01)
*H01S 5/00* (2006.01)
*B60R 1/00* (2006.01)

(52) U.S. Cl.
CPC ............. *H01S 3/0085* (2013.01); *B60R 1/00* (2013.01); *H01S 5/0085* (2013.01)

(58) Field of Classification Search
CPC   H01S 3/0085; H01S 3/094069; H01S 5/0085
See application file for complete search history.

(56) References Cited

U.S. PATENT DOCUMENTS

| | | | | |
|---|---|---|---|---|
| 6,532,244 | B1 * | 3/2003 | Dewey | G02B 6/2808 372/108 |
| 6,791,739 | B2 * | 9/2004 | Ramanujan | G02F 1/035 359/279 |
| 8,523,849 | B2 * | 9/2013 | Liu | A61B 18/203 606/9 |
| 8,902,506 | B2 * | 12/2014 | Mizuyama | G02B 27/286 359/486.01 |
| 9,010,965 | B2 * | 4/2015 | Sudarshanam | G02B 27/48 362/259 |

OTHER PUBLICATIONS

MacDougal et al., "Wide Area SWIR Arrays and Active Illuminators", Proc. of SPIE, vol. 8268, 82682Y-1, 2012, 8 pages.

* cited by examiner

*Primary Examiner* — Jack Berman
(74) *Attorney, Agent, or Firm* — Locke Lord LLP; Scott D. Wofsy; Alicia J. Carroll

(57) ABSTRACT

An illuminator comprising a short-wave infrared (SWIR) laser, a fiber optic, and a lens optic. The fiber optic is coupled to the SWIR laser for mixing the modes of a beam emitted by the SWIR laser. The lens optic is coupled to the fiber optic for shaping the beam into a top-hat beam profile. A method for creating SWIR illumination includes emitting a laser beam with multiple modes from a SWIR laser, transmitting the laser beam through a multi-mode fiber optic, and transmitting the laser beam through a lens optic. Transmitting the laser beam through the multi-mode fiber optic can including mixing modes of the laser beam thereby reducing speckle and constructive and destructive interference in the laser beam. Transmitting the laser beam through the lens optic can include generating a top-hat beam profile.

14 Claims, 2 Drawing Sheets

VISION ENHANCEMENT ILLUMINATORS

BACKGROUND OF THE INVENTION

1. Field of the Invention

The present invention relates to illuminators, and, in particular, to illuminators for vision enhancement.

2. Description of Related Art

Traditional illuminators are used for vision enhancement, e.g. vision enhancement in low light conditions. Long range illumination typically requires the use of laser emitters to project the amount of optical power required for long range imaging applications. Traditional single laser emitters tend to be non-uniform due to speckle, e.g. from constructive and destructive interference patterns caused by the narrow bandwidth of the source. A solution to this problem has been to use vertical-cavity surface-emitting laser (VCSEL) arrays as the primary laser emitter source for illuminators. Traditional VCSEL arrays typically consist of tens or hundreds of tightly packed laser emitters. The large number of emitters tends to improve the uniformity over traditional single laser emitters by averaging out all of the non-uniformity caused by speckle and constructive/destructive interference patterns from any single emitter in the array. Unfortunately, VCSEL arrays are not available at all wavelengths, which can limit VCSEL arrays from use in certain applications.

Such conventional methods and systems have generally been considered satisfactory for their intended purpose. However, there is still a need in the art for systems and methods that allow for improved illuminators and vision enhancement. The present invention provides a solution for these problems.

SUMMARY OF THE INVENTION

An illuminator includes a short-wave infrared (SWIR) laser, a fiber optic, and a lens optic. The fiber optic is coupled to the SWIR laser for mixing modes of a beam emitted by the SWIR laser. The lens optic is coupled to the fiber optic for shaping the beam into a top-hat beam profile.

The SWIR laser can be a 1550 nm SWIR laser and/or an edge emitting SWIR laser. The SWIR laser can have a wavelength ranging from about 1000 nm to about 3000 nm. The illuminator can include a pulse width modulator operatively connected to the SWIR laser to modulate the SWIR laser at about 5 kHz to vary modes emitted from the SWIR laser. The illuminator can include an illuminator housing wherein the SWIR laser, the fiber optic and the lens optic are mounted within the illuminator housing. The SWIR laser can be configured to emit a beam with a bandwidth of greater than 10 nm at full-width half maximum. In an exemplary embodiment, the bandwidth can be greater than 15 nm at full-width half maximum.

The illuminator can include a spool in the illuminator housing between the SWIR laser and the lens optic. At least a portion of the fiber optic between the SWIR laser and the lens optic can be wrapped circumferentially around the spool. In an exemplary embodiment, a circumferential surface of the spool has a 1 inch (2.54 cm) diameter, the fiber optic length can range from about 0.9 meters to about 1.1 meters in length, and/or the fiber optic can be a multi-mode fiber optic. The lens optic can include a beam shaping optic configured to shape the beam into a divergence ranging from two degrees to seven degrees.

A method for creating SWIR illumination includes emitting a laser beam with multiple modes from a short-wave infrared (SWIR) laser, transmitting the laser beam through a multi-mode fiber optic, and transmitting the laser beam through a lens optic. Transmitting the laser beam through the multi-mode fiber optic can include mixing modes of the laser beam thereby reducing speckle and constructive and destructive interference in the laser beam. Transmitting the laser beam through the lens optic can include generating a top-hat beam profile.

The method can include modulating the SWIR laser at about 5 kHz with a pulse width modulator to vary the modes emitted from the SWIR laser and to break up the laser beam. Transmitting the laser beam through a lens optic can include shaping the beam into a divergence ranging from about two degrees to about seven degrees.

These and other features of the systems and methods of the subject invention will become more readily apparent to those skilled in the art from the following detailed description of the preferred embodiments taken in conjunction with the drawings.

BRIEF DESCRIPTION OF THE DRAWINGS

So that those skilled in the art to which the subject invention appertains will readily understand how to make and use the devices and methods of the subject invention without undue experimentation, preferred embodiments thereof will be described in detail herein below with reference to certain figures, wherein.

DETAILED DESCRIPTION OF THE PREFERRED EMBODIMENTS

Figure 1:
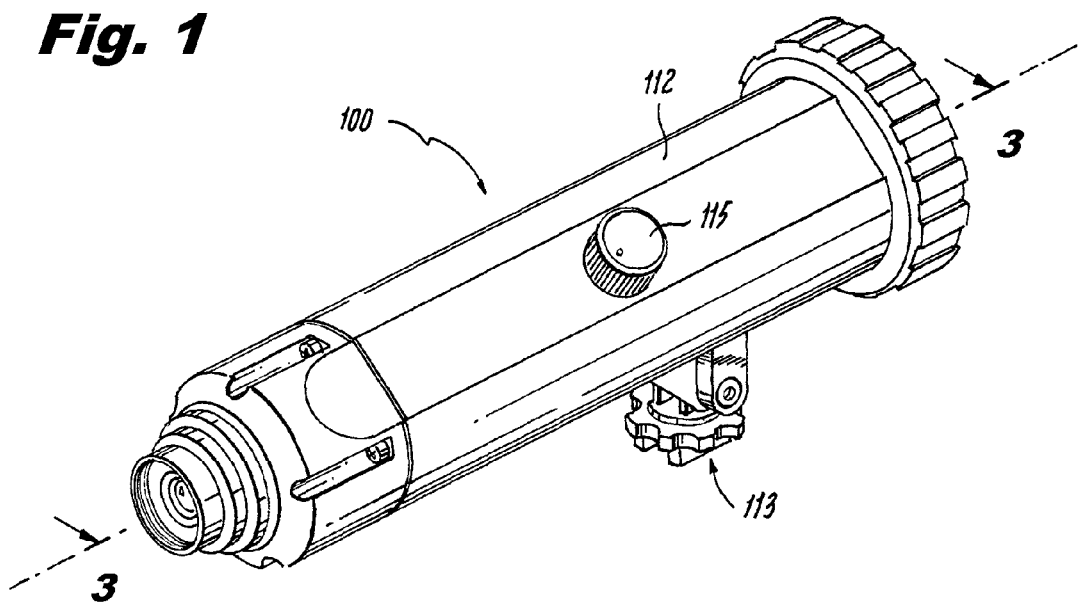
FIG. 1 is a perspective view of an exemplary embodiment of an illuminator constructed in accordance with the present disclosure.

Reference will now be made to the drawings wherein like reference numerals identify similar structural features or aspects of the subject disclosure. For purposes of explanation and illustration, and not limitation, a perspective view of an exemplary embodiment of the illuminator in accordance with the disclosure is shown in FIG. 1 and is designated generally by reference character 100. Other embodiments of illuminators in accordance with the disclosure, or aspects thereof, are provided in FIGS. 2-3, as will be described.

As shown in FIG. 1, an illuminator 100 includes an illuminator housing 112. Illuminator 100 also includes a mount 113 and control switch 115. Those skilled in the art will readily appreciate that mount 113 can be adapted to fit a variety of suitable mounts, such as a rail mount, cold shoe mount, or the like. It is contemplated that control switch 115 can have three variable settings for illuminator 100, for example, 0.5 W, 1.3 W, and 2 W. Other varying light settings can be used depending on the distance from the object being illuminated, the ambient light level, the transmission and or the full-width half-maximum of the optic used on a SWIR camera/imager, described below.

Figure 2:
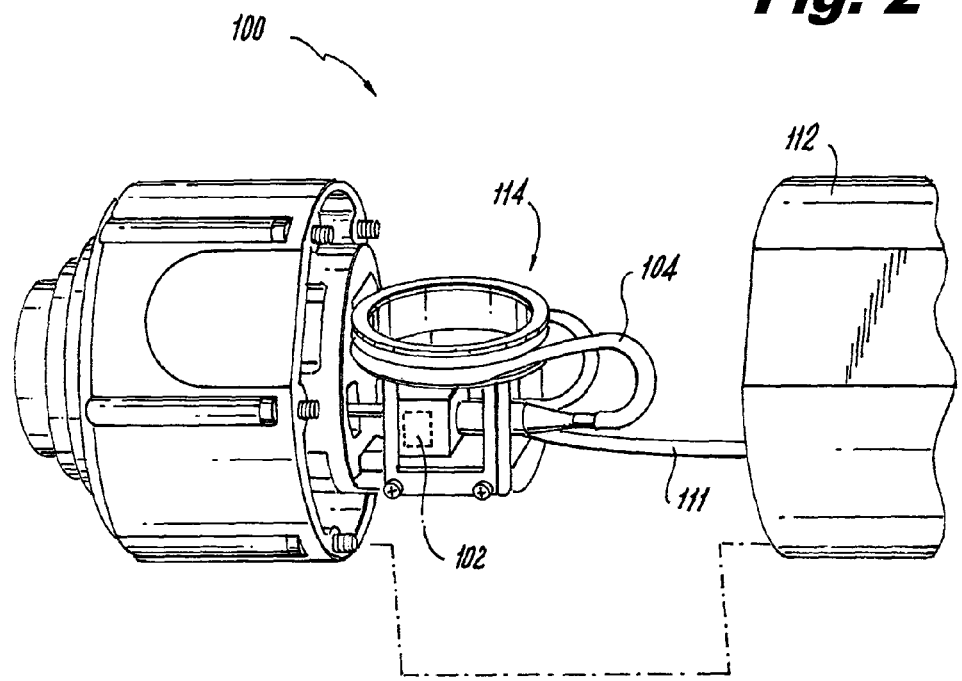
FIG. 2 is a perspective view of a portion of the illuminator of FIG. 1, showing the SWIR laser and the fiber optic.

With reference now to FIG. 2, illuminator 100 also includes a short-wave infrared (SWIR) laser 102 and a multi-mode fiber optic 104. Laser 102 and fiber optic 104 are mounted within illuminator housing 112. Fiber optic 104 is coupled to laser 102 in a conventional fashion for mixing modes of a beam 108, shown in FIG. 3, emitted by laser 102. Laser 102 is a 1550 nm edge emitting SWIR laser and is configured to emit a beam 108 with a bandwidth of greater than 15 nm at full-width half maximum. In other embodiments, the laser can emit in a range from about 1000 to 3000 nm, and/or the bandwidth can be greater than 10 nm at full-width half maximum.

Figure 3:
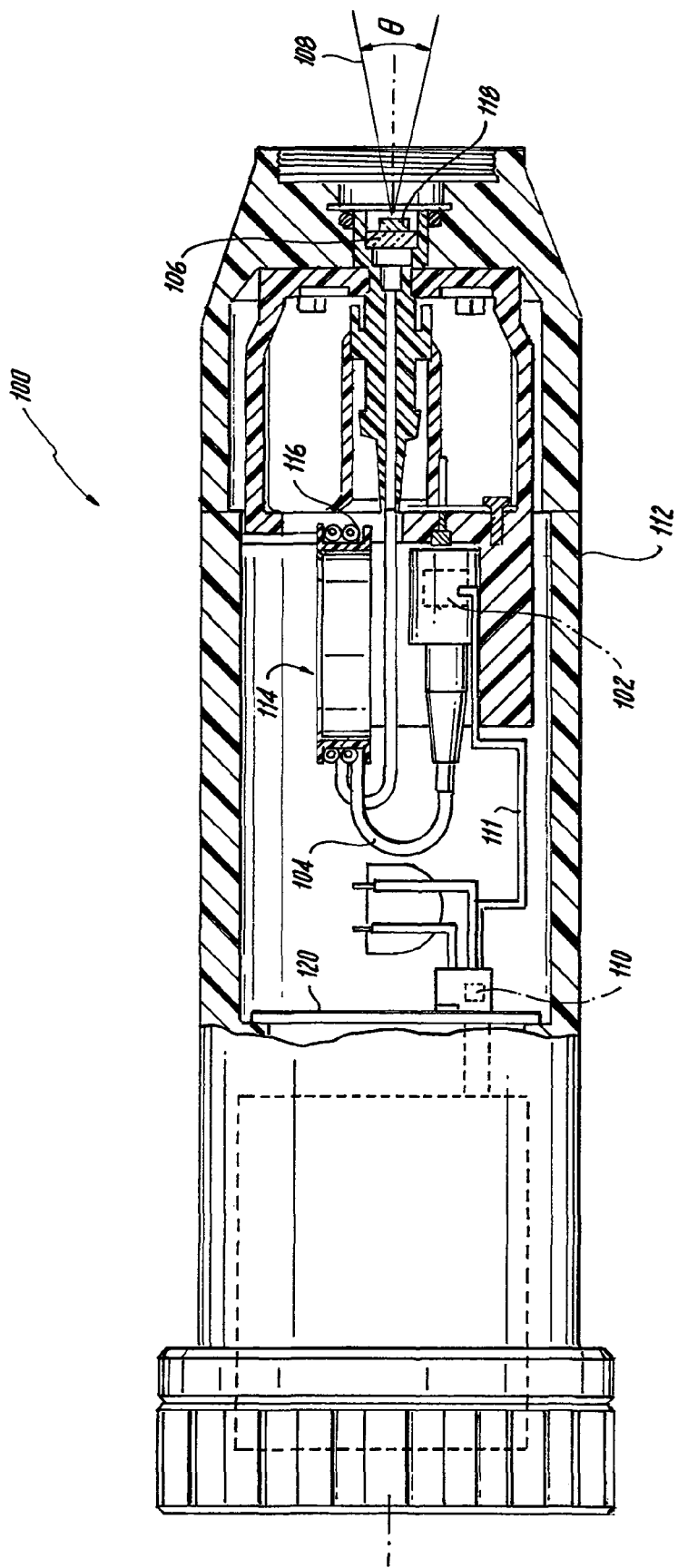
FIG. 3 is a cross-sectional side-elevation view of a portion of the illuminator of FIG. 1, schematically showing the laser beam emitted from the housing.

Now with reference to FIG. 3, illuminator 100 includes a lens optic 106 and a circuit board 120. Lens optic 106 and circuit board 120 are mounted within illuminator housing 112. It is contemplated the circuit board 120 can control one or more SWIR lasers, depending on the number of lasers 102 required for a given application. If more than one SWIR laser is used, it is contemplated that there would be additional fiber optics, e.g. fiber optic 104, and lens optics, e.g. lens optic 106, coupled to the additional SWIR lasers. It is also contemplated that laser 102 can be connected to a power supply. The power supply can be internal, e.g. within housing 112, or external.

With continued reference to FIG. 3, illuminator 100 includes a spool 114 in illuminator housing 112 disposed between laser 102 and lens optic 106. It is contemplated that spool 114 can have a circular cylinder shape, an elliptical cylinder shape, or any other suitable shape with smooth curves that does not violate the fiber optic bend radius specification for fracture. A portion of fiber optic 104 between laser 102 and lens optic 106 is wrapped circumferentially around spool 114. Those skilled in the art will readily appreciate that the circular path the light has to travel through fiber optic 104, mixes the modes of the SWIR laser emission, therein reducing non-uniformity caused by speckle and interference found in traditional SWIR laser emissions. It is contemplated that fiber optic 104 length can range from about 0.9 meters to about 1.1 meters in length, for example fiber optic can be 1 meter in length. While described herein as ranging from about 0.9 meters to 1.1 meters in length, it is contemplated that any fiber optic length can be used. The shorter the length, the more compact the illuminator can be, but there tends to be a trade off with increasing non-uniformity. Those skilled in the art will also readily appreciate that the dimensions of fiber optic 104 and spool 114 can vary depending on the application. In an illuminator with a compact size, the circumferential surface 116 of spool 114 is about 1 inch (2.54 cm) in diameter. Other size spools may also be used. The spool size and fiber optic length are selected to achieve desirable SWIR laser emission uniformity as well as desirable illuminator size.

As shown in FIG. 3, illuminator 100 includes a pulse width modulator 110 operatively connected to laser 102. Pulse width modulator 110 modulates laser 102 at 5 kHz to vary the beam modes emitted from laser 102. Pulse width modulator 110 is disposed on circuit board 120 and operatively connected to laser through a connector 111. Those skilled in the art will readily appreciate that the approximately 5 kHz pulse width modulation rate can improve the uniformity of beam 108 by varying the modes emitted from laser 102, and also by breaking up the emission to avoid continued interference.

While the modulation rate is described herein as 5 kHz, any other suitable modulation rate can be used without departing from the scope of this disclosure. It is contemplated that the modulation rate can be higher or lower as needed. Those skilled in the art will readily appreciate using a pulse width modulation rate with a substantially lower frequency may tend to increase non-uniformity. Lens optic 106 is coupled to fiber optic 104 for shaping beam 108 into a top-hat beam profile characterized by a very flat and uniform circular emission that has low spatial variation. Lens optic 106 also includes a beam shaping optic 118 to shape beam 108 into a divergence where beam angle θ can range from about two degrees to about seven degrees. Any other suitable beam angle can be used without departing from the scope of this disclosure. For example, additional optics can be added to housing 112 via threads, such as the threads on the right hand side of housing 112, as oriented in FIG. 3.

While illuminator housing 112 is shown and described as providing space for a single SWIR laser 102, fiber optic 104, and lens optic 106, those skilled in the art will readily appreciate that any suitable number of SWIR lasers 102, fiber optics 104, and lens optics 106, can be provided in a single illuminator housing 112 for producing one or more respective beams, e.g. beam 108.

Now with reference to FIGS. 1-3, a method for creating SWIR illumination includes emitting a laser beam, e.g. laser beam 108, with multiple modes from a SWIR laser, e.g. laser 102, transmitting the laser beam through a multi-mode fiber optic, e.g. fiber optic 104, and transmitting the laser beam through a lens optic, e.g. lens optic 106. Transmitting the laser beam through the multi-mode fiber optic mixes the modes of the laser beam thereby reducing speckle and constructive and destructive interference in the laser beam. Transmitting the laser beam through the lens optic generates a top-hat beam profile.

The method also includes modulating the SWIR laser at 5 kHz with a pulse width modulator, e.g. pulse width modulator 110, to vary the modes emitted from the SWIR laser and to break up the laser beam. Transmitting the laser beam through a lens optic shapes the beam into a divergence, e.g. ranging from two degrees to ten degrees. Those skilled in the art will readily appreciate that the methods and systems described above provide for an illuminator that provides uniform imagery with a narrow beam divergence for long range illumination.

Those skilled in the art will readily appreciate that illuminator 100 can be configured to connect to an imager in a SWIR imaging system. For example, an imager can have a SWIR sensor configured to form an image of an object illuminated by the 1550 nm beam 108 emitted by illuminator 100. The image can be used in a monitoring system, e.g. a security monitoring system, optical instruments, e.g. binoculars, or optionally be displayed on a display, e.g. a display found in a vehicle, or in any other suitable application.

The methods and systems of the present disclosure, as described above and shown in the drawings, provide for illuminators in the SWIR bandwidth of 1550 nm with superior properties including improved uniformity and range and compact size. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:

1. An illuminator comprising:
    a short-wave infrared (SWIR) laser configured to emit a beam with a bandwidth of greater than 10 nm at full-width half maximum;
    a pulse width modulator operatively connected to the SWIR laser;
    a fiber optic coupled to the SWIR laser for mixing modes of a beam emitted by the SWIR laser; and
    a lens optic coupled to the fiber optic for shaping the beam into a top-hat beam profile.

2. An illuminator as recited in claim 1, wherein the SWIR laser is a 1550 nm SWIR laser.

3. An illuminator as recited in claim 1, wherein the SWIR laser wavelength ranges from 1000 nm to 3000 nm.

4. An illuminator as recited in claim 1, wherein the SWIR laser is an edge emitting SWIR laser.

5. An illuminator as recited in claim 1, wherein the fiber optic is a multi-mode fiber optic.

6. An illuminator as recited in claim 1, further comprising an illuminator housing wherein the SWIR laser, the fiber optic and the lens optic are mounted within the illuminator housing.

7. An illuminator as recited in claim 6, further comprising a spool in the illuminator housing disposed between the SWIR laser and the lens optic, wherein at least a portion of the fiber optic between the SWIR laser and the lens optic is wrapped circumferentially around the spool.

8. An illuminator as recited in claim 7, wherein a cylinder defined by a circumferential surface of the spool has a 1 inch (2.54 cm) diameter.

9. An illuminator as recited in claim 1, wherein the fiber optic length ranges from about 0.9 meters to 1.1 meters in length.

10. An illuminator as recited in claim 1, wherein the lens optic includes a beam shaping optic configured to shape the beam into a divergence ranging from two degrees to seven degrees.

11. An illuminator as recited in claim 1, wherein the pulse width modulator is configured to modulate the SWIR laser at 5 kHz to vary modes emitted from the SWIR laser.

12. A method for creating SWIR illumination comprising:
emitting a laser beam with multiple modes from a SWIR laser configured to emit a beam with a bandwidth of greater than 10 nm at full-width half maximum;
modulating the SWIR laser with a pulse width modulator to vary the modes emitted from the SWIR laser and to break up the laser beam;
transmitting the laser beam through a multi-mode fiber optic to mix modes of the laser beam thereby reducing speckle and constructive and destructive interference in the laser beam; and
transmitting the laser beam through a lens optic to generate a top-hat beam profile.

13. A method as recited in claim 12, wherein transmitting the laser beam through the lens optic includes shaping the beam into a divergence ranging from two degrees to seven degrees.

14. A method as recited in claim 12, wherein modulating the SWIR laser with a pulse width modulator includes modulating the SWIR laser at 5 kHz.

* * * * *